United States Patent [19]

Uesugi et al.

[11] Patent Number: 5,393,577
[45] Date of Patent: Feb. 28, 1995

[54] METHOD FOR FORMING A PATTERNED LAYER BY SELECTIVE CHEMICAL VAPOR DEPOSITION

[75] Inventors: Fumihiko Uesugi; Shunji Kishida, both of Tokyo, Japan

[73] Assignee: NEC Corporation, Tokyo, Japan

[21] Appl. No.: 717,603

[22] Filed: Jun. 19, 1991

[30] Foreign Application Priority Data

Jun. 19, 1990 [JP] Japan ............................. 2-160107
Jul. 13, 1990 [JP] Japan ............................. 2-186341
Feb. 28, 1991 [JP] Japan ............................. 3-034756
Mar. 20, 1991 [JP] Japan ............................. 3-081840

[51] Int. Cl.⁶ ............................................. B05D 3/06
[52] U.S. Cl. ............................................. 427/586; 156/643;
    427/99; 427/252; 427/282; 427/287; 427/314
[58] Field of Search ................. 427/282, 287, 252, 99,
    427/56.1, 314, 586, 585; 156/643

[56] References Cited

U.S. PATENT DOCUMENTS 3,206,326  9/1955  Whaley et al. .................. 427/252
4,328,261  5/1982  Heinecke et al. ............... 427/252
4,716,050 12/1987  Green et al. ................... 427/252
5,364,681 11/1991  Berry et al. .................... 427/54.1

Primary Examiner—Janyce Bell
Attorney, Agent, or Firm—Sughrue, Mion, Zinn, Macpeak & Seas

[57] ABSTRACT

In a method for forming a patterned layer by the selective CVD, the material gas for forming a patterned layer is introduced into a CVD chamber in which a semiconductor substrate is set, and then the CVD process is carried out at a predetermined temperature of the substrate while a light having a predetermined wavelength is irradiated selectively through a mask having a predetermined pattern on the substrate. The CVD layer grows on the area of the surface of the substrate where the light is not irradiated, however, the CVD growth is hindered on the area where the light is irradiated, by the presence of a thin layer which prevent the CVD growth, for example.

8 Claims, 9 Drawing Sheets

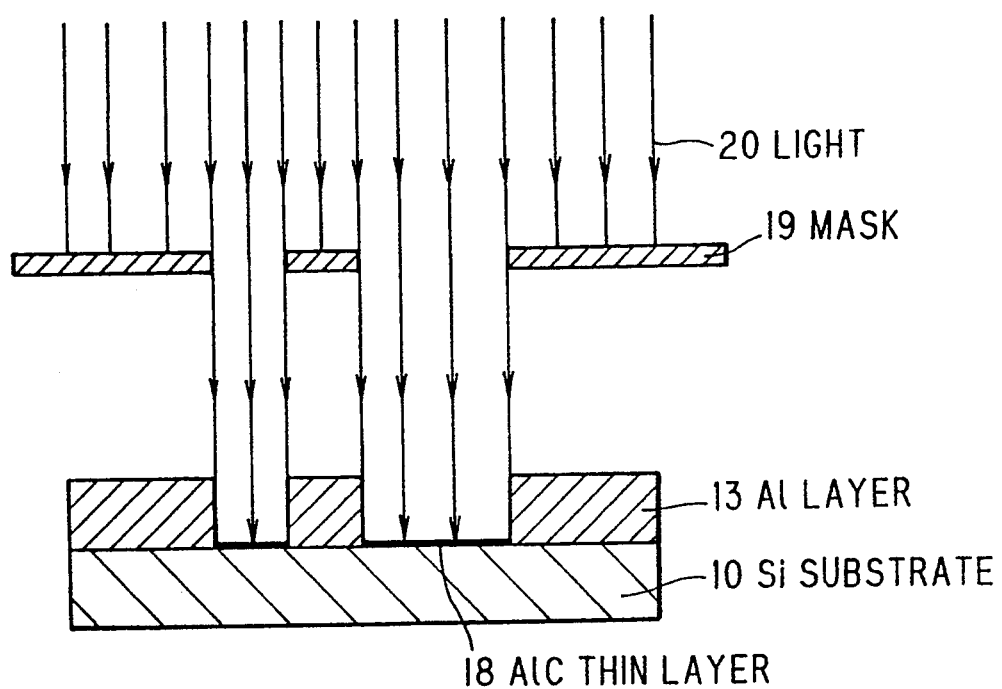

METHOD FOR FORMING A PATTERNED LAYER BY SELECTIVE CHEMICAL VAPOR DEPOSITION

FIELD OF THE INVENTION

This invention relates to a method for forming a patterned layer by selective Chemical Vapor Deposition (CVD), and more particularly to, a method for forming a patterned layer by selective CVD in which a patterned layer is formed on a semiconductor substrate to fabricate a semiconductor device.

BACKGROUND OF THE INVENTION

In a conventional method for forming a patterned layer such as a wiring (interconnection) layer to fabricate an LSI (Large-Scale Integrated circuit), a patterned $SiO_2$ layer is formed on a Si substrate. A poly-Si layer is then deposited on the $SiO_2$ layer by CVD, and an Al layer is formed on the poly-Si layer by evaporation or CVD. Then, the Al layer is etched partly by photolithography to have a predetermined pattern. Such a method for forming a wiring layer of an LSI is described on pages 85 to 100 of Nikkei Microdevice, December number, 1986, for example.

However, the conventional method for forming a patterned layer needs the complicated photolithography process including steps of coating, exposing and developing of resist. Further, such a photolithography process causes contamination of a fabricated wafer, so that a yield of products may reduce. Additionally, two kinds of etchants are required to etch the poly-Si layer and the Al layer.

Recently, a photo-induced selective CVD method has been used for forming a patterned layer. In the conventional method for forming a patterned layer by the photo-induced selective CVD, deposition of a CVD layer is suppressed selectively on some area of semiconductor substrate where a light having a predetermined wave length is irradiated to form a patterned CVD layer. This method has an excellent resolution in pattern transfer in comparison with a selective CVD method in which a CVD layer is deposited selectively on some area here a light is irradiated, because undesired deposition of a layer caused by a vapor decomposition is removed.

Such a conventional method for forming a patterned layer by the CVD is described in Japanese Patent Provisional Publication (Kokai) No. 62-116786 (Japanese Patent Application No. 60-254582), and on a page 592 of Extended Abstracts of the 36th Spring Meeting of the Japan Society of Applied Physics and Related Societies, Chiba, April, 2p-L-5, (1989, Spring Term). These methods use desorption of adsorbates composing a CVD layer from a surface of the semiconductor substrate, by irradiating infrared rays which resonate with a vibrational energy of bonds between the substrate and the adsorbates, or by irradiating vacuum ultraviolet rays which break the bonds between the substrate and the adsorbates.

According to the conventional method for forming a patterned layer by the photo-induced selective CVD, however, there are disadvantages as described below.

First, suppression of the CVD on irradiated area of the substrate is not sufficient, so that selectivity of growth of the CVD layer is not sufficient. The first reason is that deposition induced by thermal decomposition of the adsorbates due to the heating of the substrate by irradiating infrared rays occurs in addition with the desorption of the adsorbates, if infrared rays are used. The second reason is that photochemical CVD occurs in addition with desorption of the adsorbates.

Second, only limited kinds of light sources can be used in the method, because the light sources should be selected from those radiating infrared rays which resonate with the vibrational energy of bonds between the substrate and the adsorbates. Usually, more than two kinds of the adsorbates exist, so that many kinds of light sources each corresponding to each adsorbate to be resonated should be prepared. This makes cost high. On the other hand, if the ultraviolet rays are used for breaking the bonds between the substrate and the adsorbates, valence electrons in the adsorbates are excited from the bonding orbital to the anti-bonding orbital. This means that the initial state of the optical exciting and the final state thereof are determined, so that only a light having a wavelength corresponding to the energy equal to the gap energy of the initial and final states of the optical exciting is necessary to be used. If vacuum ultraviolet rays are used, ionization of the adsorbates occurs, so that the bonds between the substrate and the adsorbates are broken to contribute to the suppression of the CVD reaction. In this case, any light can be used so long as it has an energy larger than the threshold energy of ionization thereof, however, the suppress ion the CVD reaction by desorption of the adsorbates is not sufficient by the ionization due to the valence band excitation.

Third, it is difficult to obtain a patterned layer having sharp edges because of a light diffraction. The irradiation area of the light is defined by a profile of an opening in a mask which to be used for patterning, and the sharp edges can be obtained by avoiding the diffraction of the light to the non-irradiation area. The degree of the diffraction is linear to the wavelength of the light, so that the diffraction is much limited by using vacuum ultraviolet rays having a wavelength shorter than that of infrared rays, however it is still not sufficient for avoiding the diffraction.

SUMMARY OF THE INVENTION

Accordingly, it is an object of the invention to provide a method for forming a patterned layer by the selective CVD in which an effective selectivity in deposition of a CVD layer can be obtained.

It is a further object of the invention to provide a method for forming a patterned layer by the selective CVD in which a light having a wavelength of wide range can be used.

It a still further object of the invention to provide a method for forming a patterned layer by the selective CVD in which a patterned layer having sharp edges can be obtained.

It is a yet still further object of the invention to provide a method for forming a patterned layer by the selective CVD in which a patterned layer can be formed by a shortened process time.

According to a feature of the invention, a method for forming a patterned layer by the selective CVD comprises:

providing a substrate in a CVD chamber;

introducing material gas of a patterned layer into the CVD chamber; and heating the substrate to a predetermined temperature while irradiating a light selectively to a surface of the substrate to grow a CVD layer on the substrate selectively by blocking the growth of the CVD layer on an area where the light is irradiated.

BRIEF DESCRIPTION OF THE DRAWINGS

The invention will be explained in more detail in conjunction with appended drawings wherein:

FIG. 2 is an explanatory view explaining a basic process of a method for forming a patterned layer on a semiconductor substrate by the selective CVD according to the invention;

DESCRIPTION OF THE PREFERRED EMBODIMENTS

Before describing a selective CVD method in preferred embodiments according to the invention, the conventional method for forming a patterned layer described before will be explained in conjunction with FIGS. 1A to 1C.

Figure 1A:
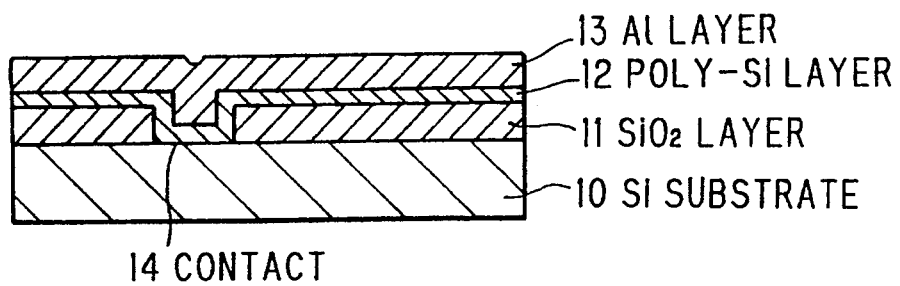
FIGS. 1A, 1B and 1C are flow sheets illustrating a conventional method for forming a patterned layer on a semiconductor substrate.
Figure 1B:
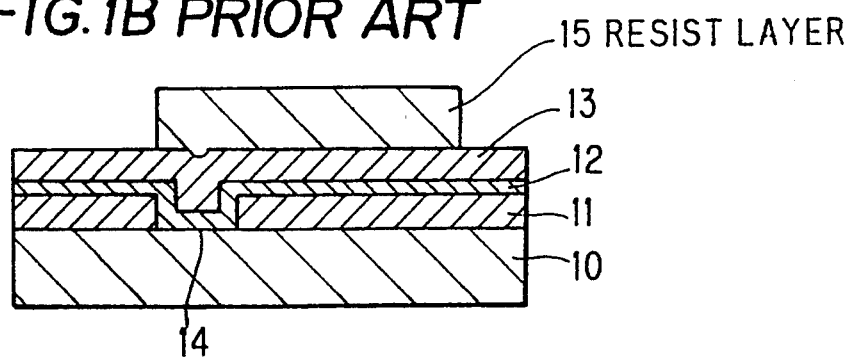
Figure 1C:
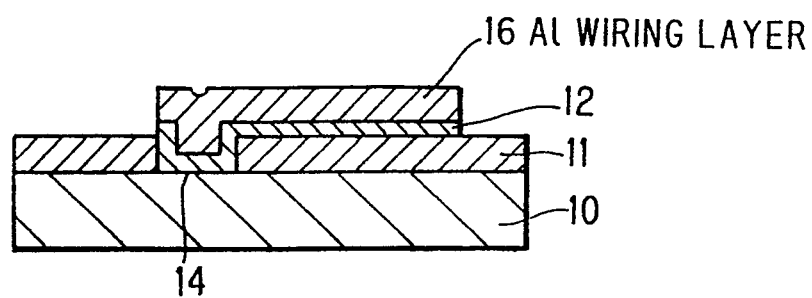

In the conventional method for forming a patterned layer, as shown in FIG. 1A, a patterned $SiO_2$ layer 11 having a contact 14 is formed on a Si substrate 10. A poly-Si layer 12 is then deposited on the $SiO_2$ layer 11 by CVD, and an Al layer 13 is formed on the poly-Si layer by evaporation or CVD. Then, as shown FIG. 1B, a resist layer 15 is formed to cover a portion of the Al layer 13 where a wiring layer is formed by photolithography including steps of coating, exposing and developing of the resist layer 15. After that, the Al layer 13 and the poly-Si layer 12 are etched respectively by etchants to form an Al wiring layer 16 on the poly-Si layer 12, as shown in FIG. 1C.

Next, a basic process of forming a patterned layer on a semiconductor substrate by the selective CVD according to the invention will be explained.

In FIG. 2, a light 20 is irradiated through a mask 19 which has a predetermined pattern on a portion of the Si substrate 10. An Al layer 13 is deposited on the non-irradiated area of the Si substrate 10 by CVD. However, the Al layer 13 is not deposited on the irradiated area, because an AlC thin layer which is formed thereon blocks the growth of the Al layer 13.

Figure 3:
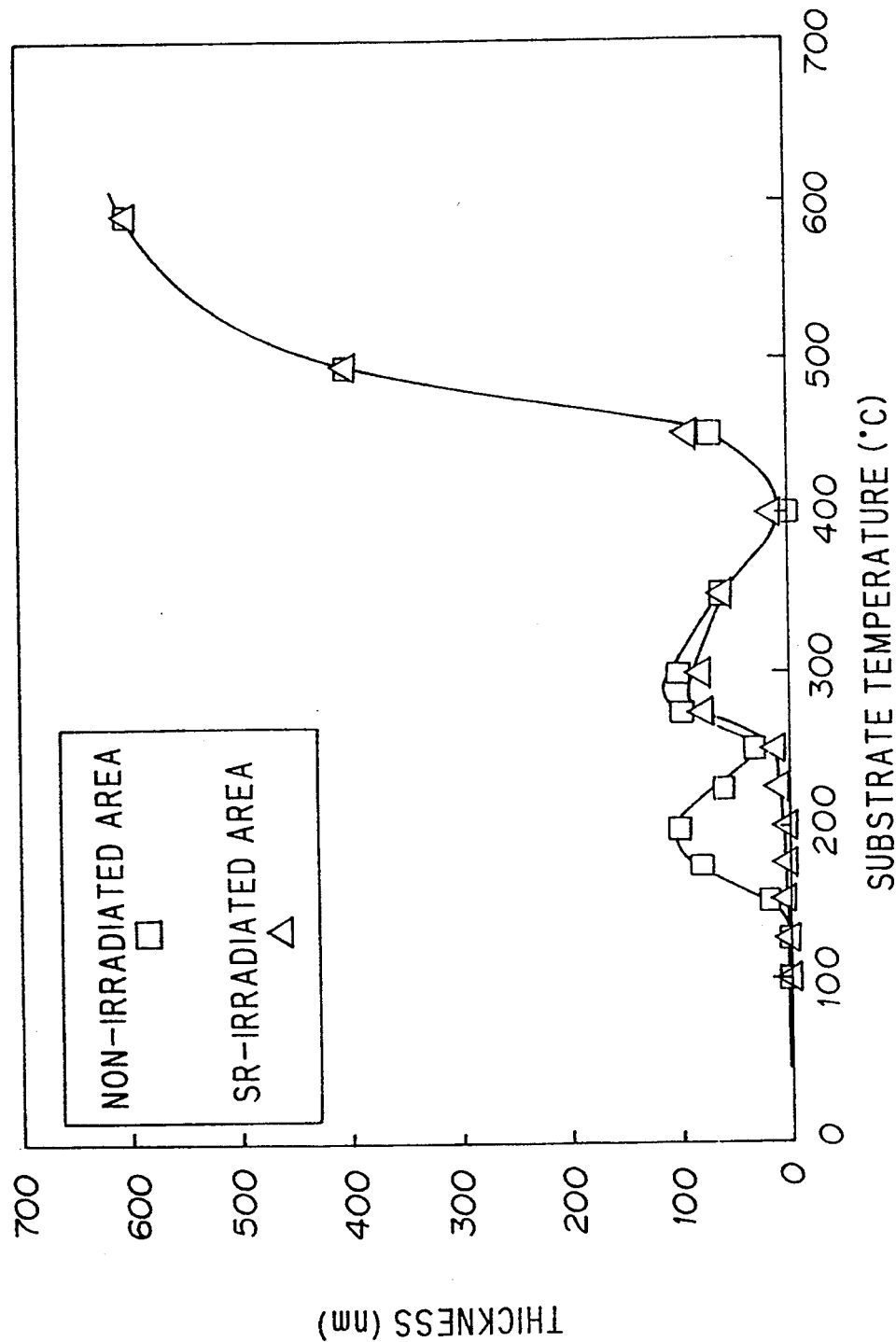
FIG. 3 is a graph of a relation between the thickness of a CVD layer and the substrate temperature in the method for forming a patterned layer by the selective CVD according to the invention.

Here, a relation between the thickness of a CVD layer and the substrate temperature will be explained in FIG. 3.

The CVD layer, that is Al layer, is deposited on a Si substrate by CVD under the presence of dimethylaluminumhydride (DMAH) as CVD material gas. The results show that the Al layer does not grow on the irradiated area at a temperature of the Si substrate in the range of 150° C. to 300° C., but on the non-irradiated area, when the light having a wavelength of approximately 4 nm is irradiated. Therefore, the selective CVD can be realized on such a condition.

In this case, a clean surface of the Si substrate is obtained by heating the substrate for 10 minutes a 1000° C. The Al layer grows at a temperature at least in the vicinity of 50° C. if the substrate has a clean surface. However, if the substrate does not experience a cleaning process, the Al layer may not grow until at 250° C. Therefore, it is possible to grow the Al layer at a relatively low temperature compared with the conventional method, and the interface reaction between Al and Si may be avoided. These are described on pages 2657 to 2661 of Vol. 29, Applied Physics letters, 1990.

It will be described now why the CVD growth starts at a relatively low temperature when the substrate has a clean surface. The suppression of the CVD growth is due to the difference of the reacting speed of adsorption between the irradiated area and the non-irradiated area of the substrate. If the substrate has a clean surface, decomposition reaction of the adsorbates begins at a low temperature, because the clean surface is active. Therefore, the suppression of the CVD growth may realize in the wide range of the substrate temperature by obtaining the clean surface of the substrate.

The AlC layer may be formed even by irradiating a light which is unable to excite inner shell electrons, however, the effects become large when a light which is able to excite inner shell electrons is used. The CVD material vapor is diffused to the non-irradiated area of the substrate, however, the degree of formation of the AlC layer is low on the non-irradiated area, so that CVD layer is grown thereon. Therefore, the selectivity is excellent.

The diffraction of the light may occur at the boundary of the irradiated area and the non-irradiated area, so that the suppression of the CVD growth may occur even in the non-irradiated area. However, if the light having a short wavelength so as to excite inner shell electrons is used, the degree of the diffraction and the intensity of the diffraction light become small by two or three figures, so that the influence of diffraction may be reduced.

Figure 4:
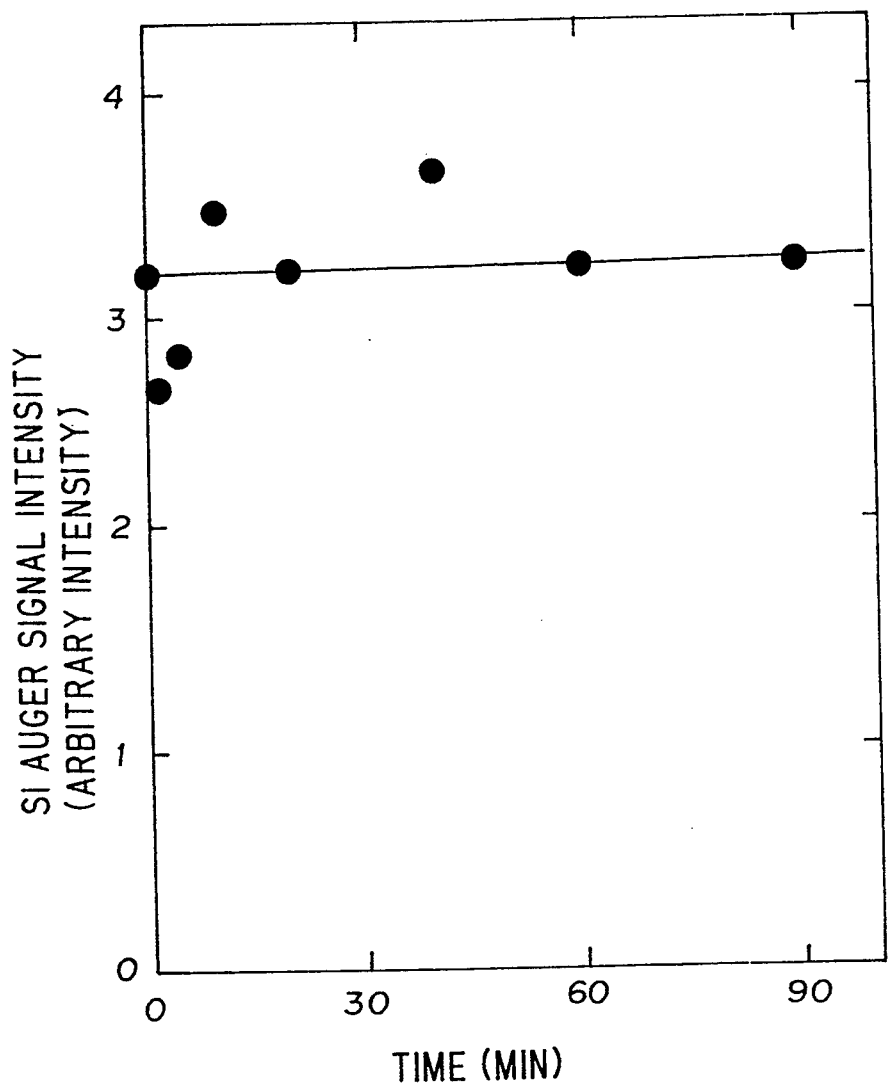
FIG. 4 is a graph of a relation between silicon Auger signal intensity and the time after stopping light irradiation in the method for forming a patterned layer by the selective CVD according to the invention.

Then, a relation between Auger signal intensity and the time will be explained in FIG. 4.

The depth of Auger electron escaping from the Si substrate suggests the AlC layer is sufficiently thin to be 2 nm at the most. The Auger signals corresponding to Si are detected and to be constant for over 90 minutes after stopping irradiating the light, so that the effects of the suppression of the deposition of the CVD layer continues for over 90 minutes after stopping the irradiation. Therefore, the process can be carried out by two steps. In the first step, the AlC layer is formed on an irradiated area of the substrate where DMAH is adsorbed by photodecomposition thereof, and in the second step, the selective CVD is carried out at a desirable temperature which is 300° C. at the highest.

Next, a method for forming a patterned layer by the selective CVD in preferred embodiments according to the invention will be described.

First, a method for forming a patterned layer by the selective CVD in a first preferred embodiment according to the invention will be explained in FIGS. 5A and 5B.

Figure 5A:
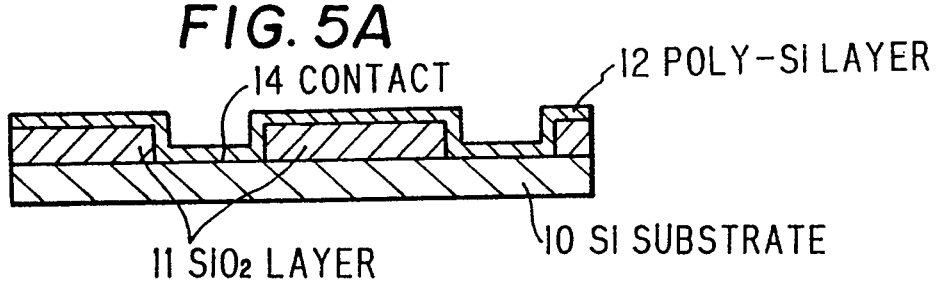
FIGS. 5A and 5B are flow sheets illustrating a method for forming a patterned layer by the selective CVD in a first preferred embodiment according to the invention.

In FIG. 5A, a SiO$_2$ layer 11 having contacts 14 is formed on a Si substrate 10, and then a poly-Si layer 12 is formed on the Si substrate 10. The fabricated Si substrate 10 is heated to a temperature of 600° C. at least to obtain a clean surface thereof.

Figure 5B:
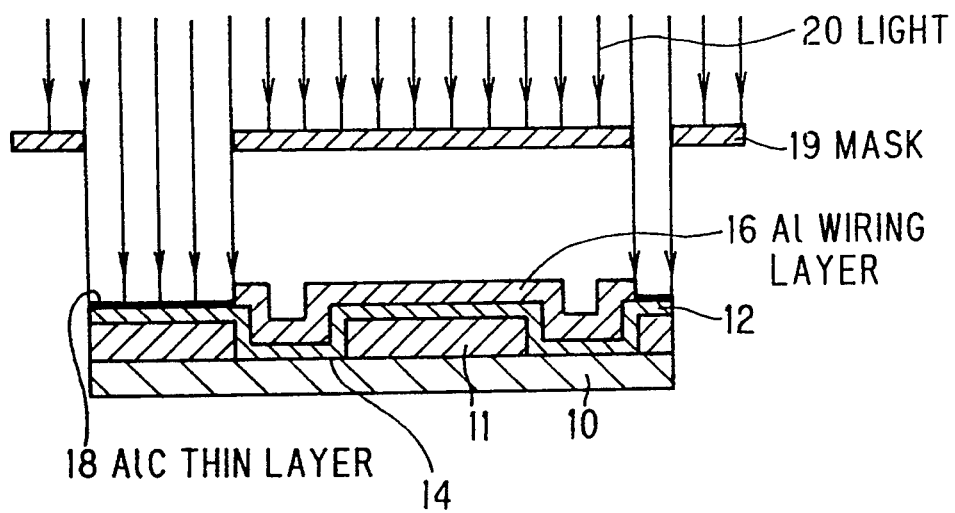

In FIG. 5B, the fabricated Si substrate 10 is mounted within a CVD chamber (not shown), and Al(CH$_3$)$_2$H gas as material gas of Al is introduced into the CVD chamber. Then, the CVD process is carried out at a temperature of the Si substrate 10 of 300° C. in which a light 20 having an energy higher than 100 eV capable of exciting inner-shell electrons of any of Al, C and Si atoms is irradiated. In the CVD process, an AlC thin layer 18 which suppresses forming the Al layer is formed on the area where the light 20 is irradiated, so that an Al wiring layer 16 is formed only the area where the light is not irradiated, as shown in FIG. 5B.

After forming the Al wiring layer 16, exposed portions of the poly-Si layer 12 are removed by plasma etching method with using the Al wiring layer 16 as a mask. The resistance between the two Al wiring layers 16 and 16 having no connection shows significantly high, so that there is no electrical leakage to provide excellent insulation therebetween.

A method for forming a patterned layer by the selective CVD in a second preferred embodiment according to the invention will be explained in FIGS. 6A to 6C.

Figure 6A:
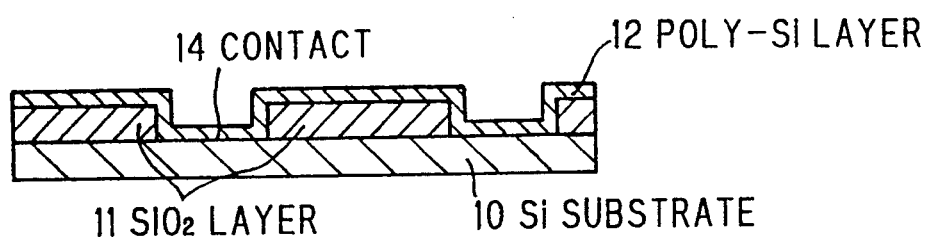
FIGS. 6A, 6B and 6B are flow sheets illustrating a method for forming a patterned layer by the selective CVD in a second preferred embodiment according to the invention.

In FIG. 6A, a fabricated Si substrate 10 having the same structure as in FIG. 5A is provided. The fabricated Si substrate 10 is heated to a temperature of 600° C. at least to obtain a clean surface thereof.

Figure 6B:
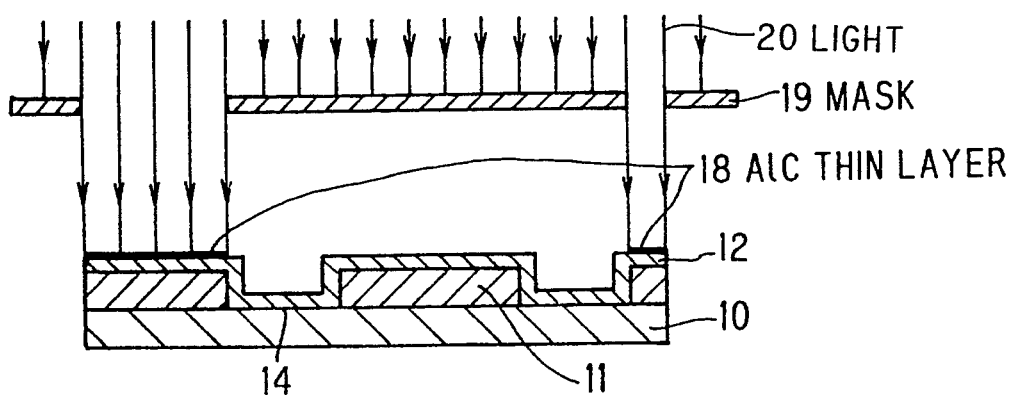

In FIG. 6B, the fabricated Si substrate 10 is mounted within a CVD chamber (not shown), and Al(CH$_3$)$_2$H gas as material gas of Al is introduced into the CVD chamber. Then, a light 20 having an energy higher than 100 eV enable to excite inner-shell electrons of any of Al, C and Si atoms is irradiated to the fabricated substrate 10, and an AlC thin layer 18 is formed on the area where the light 20 is irradiated.

Figure 6C:
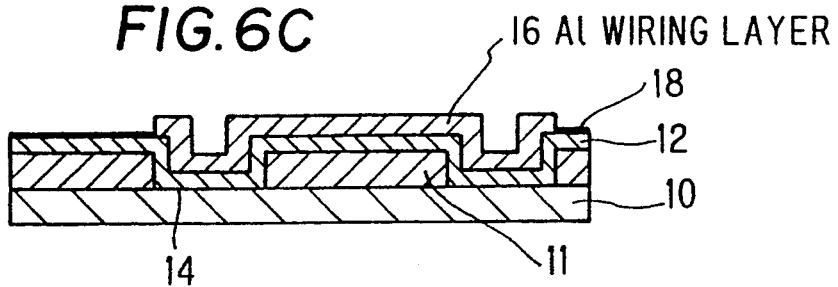

In FIG. 6C, the irradiation of the light 20 is stopped, and then the CVD process is carried out at a temperature of the Si substrate 10 of 200° C. with supplying Al(CH$_3$)$_2$H gas, so that an Al wiring layer 16 is formed only an area where the light is not irradiated.

After forming the Al wiring layer 16, exposed portions of the poly-Si layer 12 are removed by plasma etching method with using the Al wiring layer 16 as a mask. The resistance between the two Al wiring layers 16 and 16 having no connection shows significantly high, so that there is no electrical leakage to provide excellent insulation therebetween.

A method for forming a patterned layer by the selective CVD in a third preferred embodiment according to the invention will be explained in FIGS. 7A and 7B.

Figure 7A:
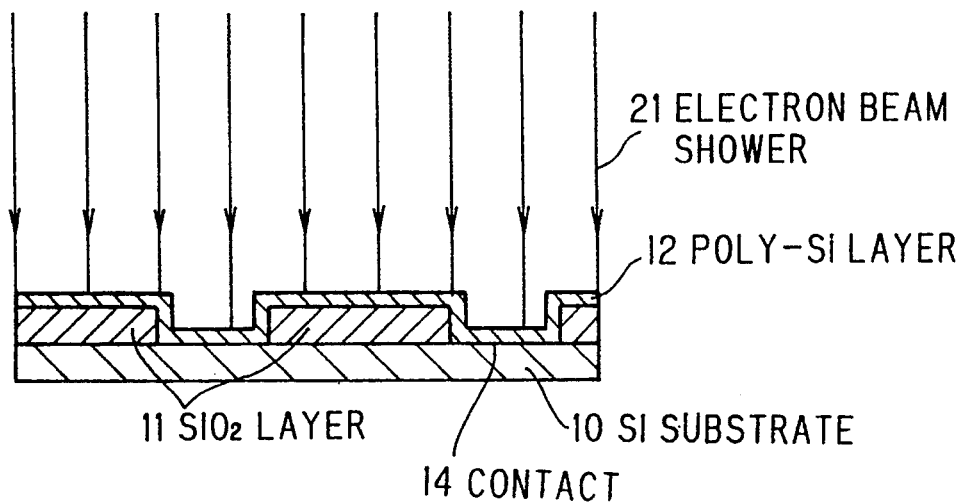
FIGS. 7A and 7B are flow sheets illustrating a method for forming a patterned layer by the selective CVD in a third preferred embodiment according to the invention.

In FIG. 7A, a fabricated Si substrate 10 having the same structure as in FIG. 5A is provided. The fabricated Si substrate 10 is mounted in a super high vacuum chamber (not shown) and is exposed with electron beam shower 21 to remove hydrogen atoms desorbing the surface of the poly-Si layer 12 to obtain a clean surface thereof. Ion beam or high energy light may be used instead of the electron beam for obtaining the clean surface of the fabricated Si substrate 10. In this process, the cleaning of the surface of the poly-Si layer 12 is carried out at a relatively low temperature, so that no damage due to a heat is added to the fabricated substrate 10. However, heating may be used if the fabricated Si substrate 10 is not affected by heating.

Figure 7B:
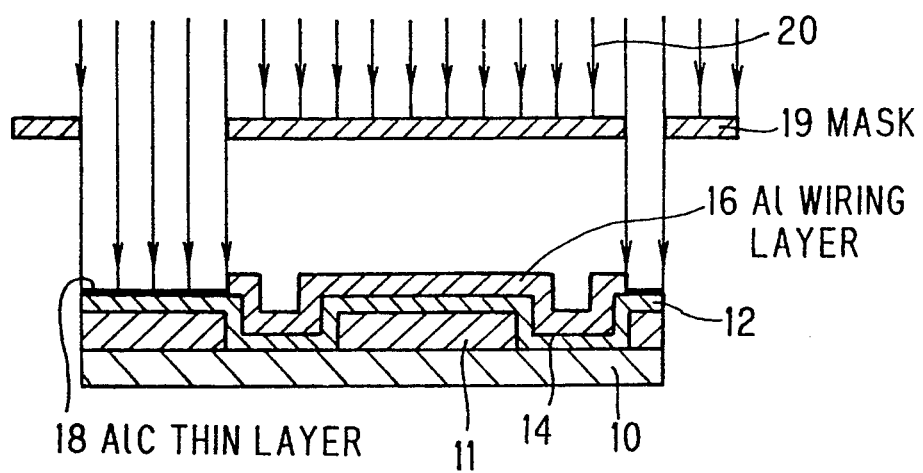

In FIG. 7B, Al(CH$_3$)$_2$H gas as material gas of Al is introduced into the chamber, and the thermal CVD is carried out while a light 20 is irradiated to the predetermined area of the Si substrate 10 defined by a pattern of a mask 19 at the substrate temperature of 200° C. The light 20 is a radiating light having a wavelength longer than 4 nm by which inner shell electrons in either Al, C or Si atom are excited. An Al wiring layer 16 which is a CVD layer grows on the area where the light 20 is not irradiated. On the other hand, an AlC layer 12 grows on the area where the light 20 is irradiated, and the Al wiring layer 16 does not grow. If the Si substrate 10 has no clean surface, the CVD layer does not grow at a temperature up to 250° C. However, the CVD layer grows even at 200° C. if the Si substrate 10 has the clean surface.

After forming the Al wiring layer 16, exposed portions of the poly-Si layer 12 are removed by plasma etching method with using the Al wiring layer 16 as a mask.

A method for forming a patterned layer by the selective CVD in a fourth preferred embodiment according to the invention will be explained in FIGS. 8A to 8C. In this preferred embodiment, the poly-Si layer not necessary for wiring is removed by optical etching with Cl$_2$ gas instead of reactive plasma etching method with Cl$_2$ like in the first to third preferred embodiments.

Figure 8A:
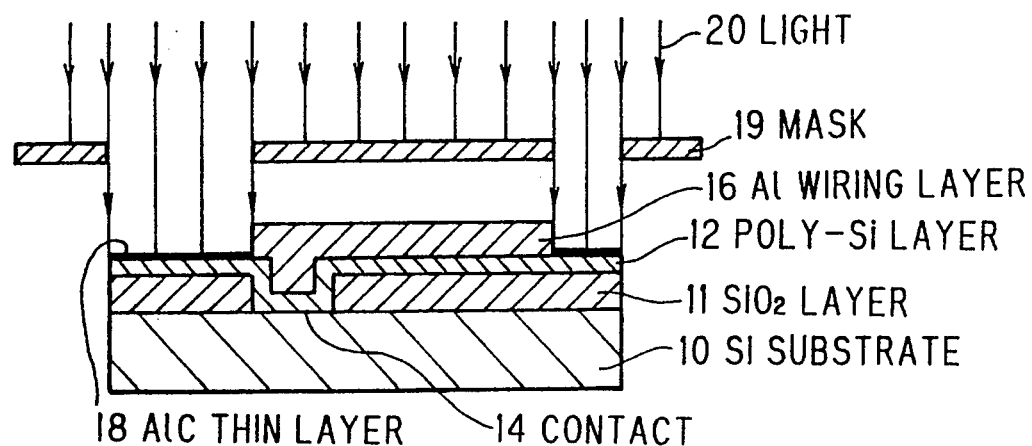
FIGS. 8A, 8B and 8C are flow sheets illustrating a method for forming a patterned layer by the selective CVD in a fourth preferred embodiment according to the invention.
Figure 8B:
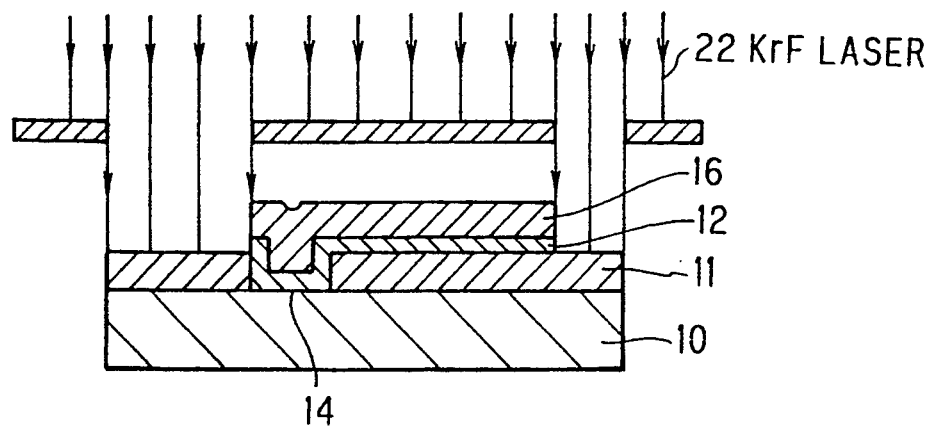
Figure 8C:
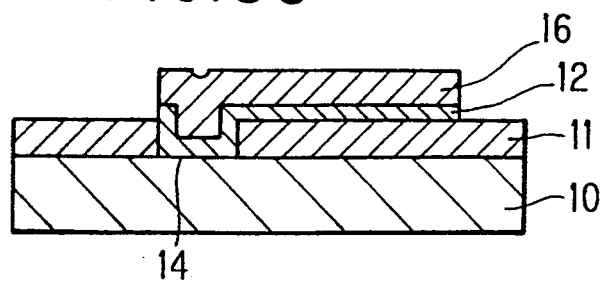

In FIG. 8A, a fabricated Si substrate 10 having the same structure as in FIG. 5A is provided in a chamber (not shown) and the same CVD process is carried out as in FIGS. 5A and 5B. After terminating the supply of Al(CH$_3$)$_2$H, Cl$_2$ gas is introduced into the chamber in which the Si substrate 10 is mounted and KrF laser 22 is irradiated to the fabricated Si substrate 10 to etch the poly-Si layer 12 optically instead of the light 20 while using the mask 19 continuously, as shown in FIG. 8B. Thus, exposed portions of the poly-Si layer 12 are removed completely and the corresponding surface of the SiO$_2$ layer 11 is exposed by the optical etching, as shown in FIG. 8C.

In this embodiment, there is no plasma etching process in which the Al wiring layer 16 is used for a mask. Therefore, there is an advantage in that the surface of the Al wiring layer 16 gets no damage caused by the etching process of the poly-Si layer 12, as well as simplification of the fabrication process of the device by omitting one step.

A method for forming a patterned layer by the selective CVD in a fifth preferred embodiment according to the invention will be explained in FIGS. 9A to 9C. In this preferred embodiment, the poly-Si layer 12 is selectively grown by CVD using a light, so that the removing process using the plasma etching or the photo-induced etching is not necessary.

Figure 9A:
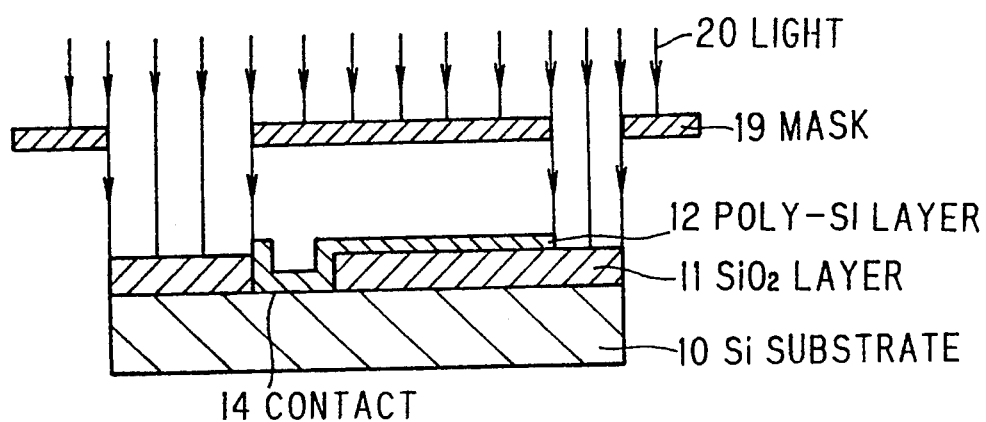
FIGS. 9A, 9B and 9C are flow sheets illustrating a method for forming a patterned layer by the selective CVD in a fifth preferred embodiment according to the invention.

In FIG. 9A, a fabricated Si substrate 10 having the same structure as in FIG. 5A is provided in a chamber (not shown), and Si$_2$H$_6$ gas is introduced into the chamber. Then, the CVD process for forming a poly-Si layer 12 is carried out while a light 20 which is a white light having a very short wavelength but longer than 4 nm at the substrate temperature of 600° C. is irradiated to the fabricated Si substrate 10, and the poly-Si layer 12 having a thickness of 50 nm is selectively formed.

Figure 9B:
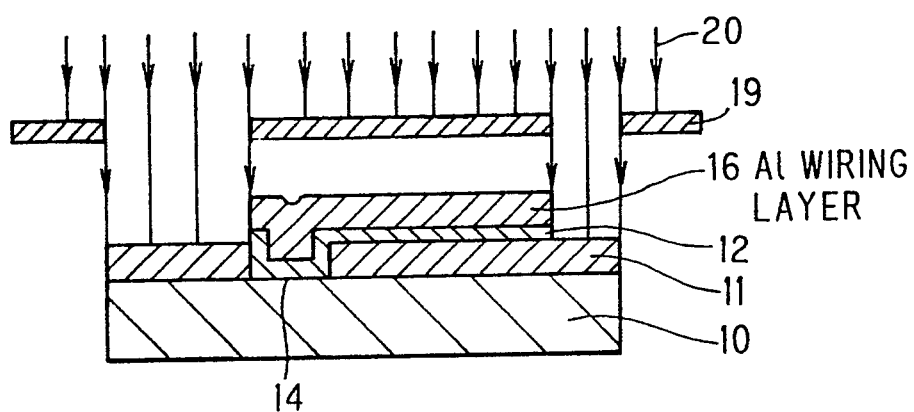
Figure 9C:
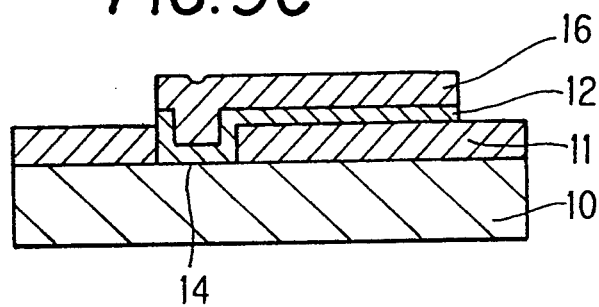

Then, as shown in FIG. 9B, $Al(CH_2)_2H$ gas is introduced into the chamber using He gas as the carrier gas, and the CVD process for forming an Al wiring layer 16 is carried out at the substrate temperature of 200° C., and the Al wiring layer 16 is selectively formed, as shown in FIG. 9C.

In this preferred embodiment, there is no etching process using the etching gas, so that no damage due to the etching process may be given to the surface of the substrate.

In the preferred embodiments described above, $Al(CH_3)_2H$ is used as material gas of Al, however, any other organic metal such as $Al\text{-}iso(C_4H_9)_3$ or one including Cl atoms may be used. Additionally, the CVD layer to be formed may be a metal layer such as Cu or Au besides Al, a semiconductor layer such as Si, GaAs or a mixed crystal thereof, or an insulation layer such as $SiO_2$. Conditions for forming the CVD layer may change in accordance with a substrate, CVD material gas, energy of a light, and a substrate temperature.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A method for forming a patterned layer by selective CVD, comprising the steps of:
   providing a substrate in a CVD chamber;
   introducing an organometallic gas into said CVD chamber; and
   heating said substrate to a temperature at which said organometallic gas is thermally decomposed to produce vapors of a metal and an organic substance, while irradiating light onto areas of a surface of said substrate, a first CVD layer being deposited onto said areas, and wherein a second CVD layer is formed from deposition of said metal from said organometallic gas onto remaining areas of said substrate, said first CVD layer blocking the growth of said second CVD layer on said areas.

2. The method for forming a patterned layer by selective CVD, according to claim 1, wherein said irradiating of said light is carried out first, and then said heating of said substrate is carried out.

3. The method for forming a patterned layer by selective CVD, according to claim 1, wherein said organometallic gas introduced into said CVD chamber is $Al(CH_3)_2H$.

4. The method for forming a patterned layer by selective CVD, according to claim 1, wherein said substrate is heated to a temperature in a range of 150° C. to 300° C.

5. The method for forming a patterned layer by selective CVD, according to claim 1, wherein said light is irradiated onto said substrate through a mask having a predetermined pattern.

6. The method for forming a patterned layer by selective CVD, according to claim 1, wherein said organometallic gas introduced into said CVD chamber is $Al(CH_3)_2H$; and wherein said first CVD layer formed on said substrate is an AlC thin layer.

7. The method for forming a patterned layer by selective CVD, according to claim 1, wherein said second CVD layer is formed, when said substrate is heated, as said patterned layer on a poly-Si layer which is formed on said substrate; and wherein said poly-Si layer is etched by using said second CVD layer as a mask after heating said substrate.

8. The method for forming a patterned layer by selective CVD, according to claim 7, wherein said poly-Si layer is etched optically by using a mask which is used for irradiating said light after heating said substrate.

* * * * *

UNITED STATES PATENT AND TRADEMARK OFFICE
CERTIFICATE OF CORRECTION

PATENT NO. : 5,393,577
DATED : February 28, 1995
INVENTOR(S) : Fumihiko UESUGI et al.

It is certified that error(s) appears in the above-identified patent and that said Letters Patent is hereby corrected as shown below:

Col. 4, line 3, after "layer", insert --18--.

Col. 5, line 46, delete "enable to excite" and insert --capable of exciting--.

Signed and Sealed this

Twentieth Day of June, 1995

Attest:

BRUCE LEHMAN

Attesting Officer      Commissioner of Patents and Trademarks